United States Patent [19]

Wada et al.

[11] Patent Number: 5,624,536
[45] Date of Patent: Apr. 29, 1997

[54] PROCESSING APPARATUS WITH COLLIMATOR EXCHANGE DEVICE

[75] Inventors: Yuichi Wada; Jiro Katsuki; Hiroshi Kobayashi, all of Kofu, Japan

[73] Assignee: Tel Varian Limited, Yamanashi-ken, Japan

[21] Appl. No.: 468,471

[22] Filed: Jun. 6, 1995

[30] Foreign Application Priority Data

Jun. 8, 1994 [JP] Japan ................................. 6-151510

[51] Int. Cl.$^6$ .................................................. C23C 14/34
[52] U.S. Cl. .................................. 204/298.11; 204/192.12; 204/298.25
[58] Field of Search ........................ 204/192.12, 298.11, 204/298.26, 298.25

[56] References Cited

U.S. PATENT DOCUMENTS

| | | | |
|---|---|---|---|
| 5,223,001 | 6/1993 | Saeki | 204/298.25 X |
| 5,223,112 | 6/1993 | Tepman | 204/298.11 |
| 5,382,339 | 1/1995 | Aranovich | 204/298.11 X |

FOREIGN PATENT DOCUMENTS 6-28007  10/1994  Japan .

*Primary Examiner*—Nam Nguyen
*Attorney, Agent, or Firm*—Beveridge, DeGrandi, Weilacher & Young, LLP

[57] ABSTRACT

The sputtering system of the present invention includes a spare collimator storage chamber for accommodating one or more spare collimators and a processing chamber, which are provided in one-piece or in communication with each other through a gate valve. A used collimator in the processing chamber is quickly and readily replaced with a new collimator stored in the spare collimator storage chamber by a collimator exchanging device without exposing the interior of the processing chamber to atmospheric air.

6 Claims, 8 Drawing Sheets

5,624,536

PROCESSING APPARATUS WITH COLLIMATOR EXCHANGE DEVICE

BACKGROUND OF THE INVENTION

The present invention relates to a processing apparatus, more specifically to a processing apparatus with a collimator exchange device for sputtering articles on objects to be processed.

A semiconductor device fabrication process conventionally uses a sputtering system to form electrodes on objects to be processed, such as semiconductor wafers and to wire the objects. The sputtering system is positioned opposed to a target of a required film forming material in a processing chamber, the interior of which is kept in a required low pressure atmosphere, whereby sputtering particles sputtered from the target are applied to the objects.

Accompanying the recent high integration of semiconductor devices, techniques for accurate micronized processing in their fabrication processes are required to be established. In internal wiring processing by sputtering systems, for example, it is necessary to bury contact holes having small diameters and large depths, i.e., high aspect ratios, with sputtering particles. But generally the sputtering processes have low step coverage characteristics, and as the cavities of the contact holes have larger aspect ratios, wiring breakage tends to take place at the bottom of the holes. This is a problem for the conventional technology.

As a countermeasure to this problem, recently a sputtering system including a collimator 5 which comprises, as shown in FIGS. 11 and 12, a plurality of circular through-holes 5a or a honeycomb of through-holes 5a formed through a metal plate of, e.g., steel or an insulating plate of ceramics has been used. The collimator 5 is positioned between a target and objects to be processed to restrict directions of radiation of sputtering particles in a cos Θ distribution from the target to select components which will substantially perpendicularly bombard the surfaces of the objects to be processed, whereby improved step coverage is obtained. By the use of such collimator, step coverage is improved by about three times the usual step coverage for contact holes of aspect ratios of above 3.0 which are required in fabrication of, e.g., 64 MB DRAMs.

But the use of a collimator in a sputtering system for improved step coverage extremely lowers film forming speeds of forming films on an object to be processed because most of sputtering particles are trapped by the collimator or are adhered to the collimator in films. For example, it is known that when the processing is conducted by applying the same electric power to a sputtering system with a collimator and to a sputtering system without a collimator, a film forming speed of the former is lowered to a speed ⅓–1/20 that of the latter. Besides, a film forming speed further lowers depending on a period of time in which the collimator is used, and a film forming amount for the collimator. In addition, film forming materials themselves trapped by the collimator peel into particles, and the collimator installed in the processing apparatus has to be periodically replaced for the prevention of generation of particles.

But in the conventional sputtering system, when the collimator is replaced, the interior of the processing vessel is released from a vacuum into the atmospheric air every time the collimator is replaced. The operation to this end is complicated and takes time. This has been a serious barrier to improvement of throughputs of the processing apparatus.

SUMMARY OF THE INVENTION

In view of the above-described problems, the present invention was made, and an object of the present invention is to provide a novel and innovational processing apparatus including a mechanism for replacing a collimator without releasing the interior of a processing vessel of the processing apparatus from a vacuum, whereby even when the collimator is used, an original film forming speed can be maintained, and an original level of generation of particles can be maintained.

To solve the above-described object, the present invention relates to a processing apparatus in which an object to be processed and a target are opposed to each other in a processing chamber, and direction of sputtering particles from the target are restricted by a collimator to adhere the sputtering particles to the object to be processed, and a spare collimator storage chamber storing one or more spare collimators is provided adjacent to the processing chamber so that collimator in the processing chamber can be replaced with a collimator in the spare collimator storage chamber by collimator exchanging means without releasing the interior of the processing chamber from a vacuum.

In the processing apparatus according to the present invention, because the spare collimator storage chamber and the processing chamber are disposed adjacent to each other, a collimator which has become, by use, a cause for decrease of a film forming speed or in a readily particle causing state can be readily and quickly replaced with a spare collimator in the spare collimator storage chamber. The processing apparatus can have improved throughputs.

DETAILED DESCRIPTION OF THE PREFERRED EMBODIMENTS

[First Embodiment]

With reference to the drawings attached hereto a first embodiment in which the processing apparatus according to the present invention is applied to a magnetron sputtering system will be explained.

Figure 1:
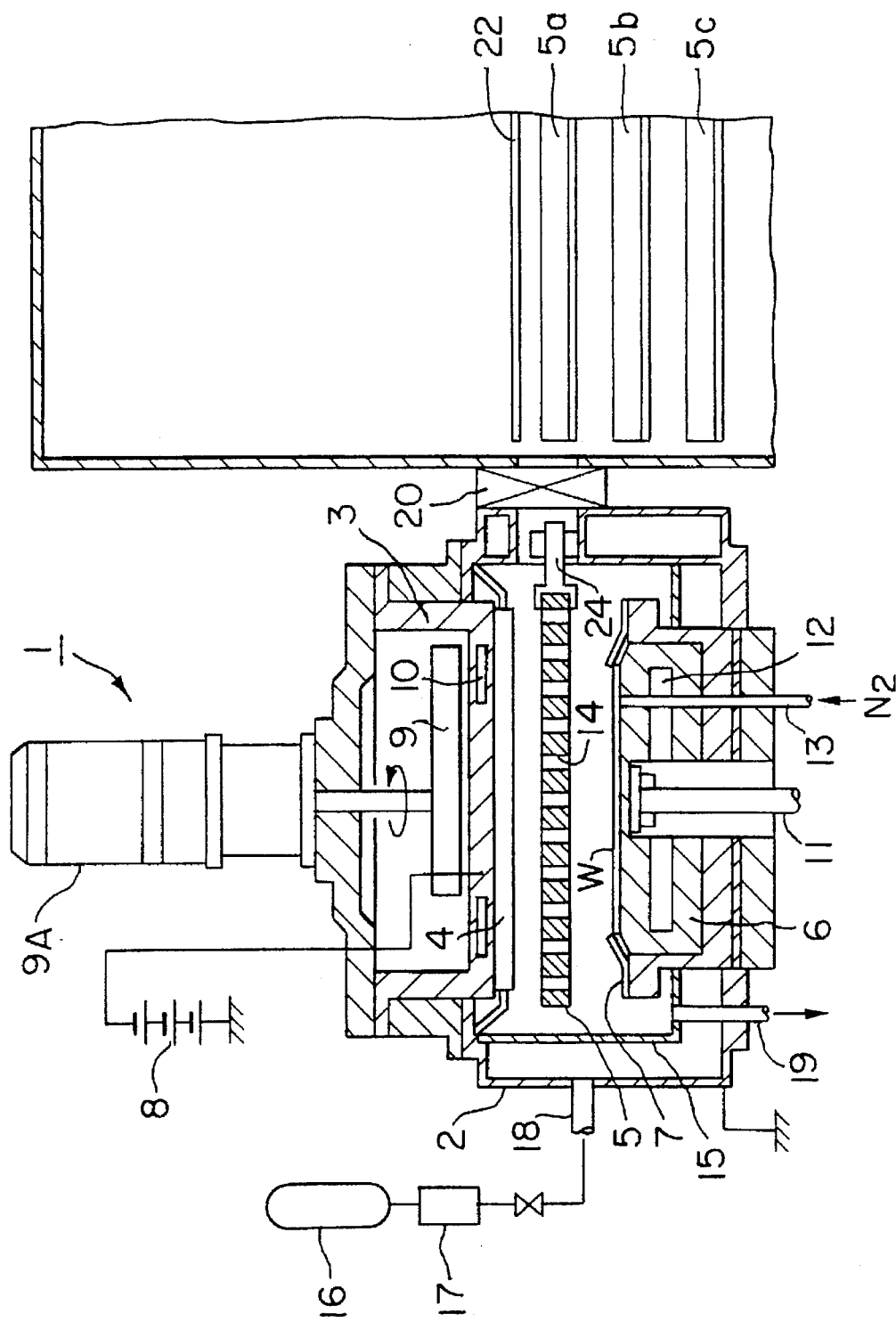
FIG. 1 is a schematic vertical sectional view of one embodiment of the DC magnetron sputtering system used in the processing apparatus according to the present invention.

As shown in FIG. 1, the sputtering system 1 includes a barrel-shaped processing vessel 2 of stainless steel or aluminium. In the processing vessel 2, a cathode 3, a target 4, a collimator 5 and an anode 6 are arranged opposed to each other in the stated order from above. The anode 6 functions also as mount which holds an object-to-be-processed W (semiconductor wafer) thereon. The semiconductor wafer is mounted on the mounting surface, secured by a chuck 7.

The cathode 3 of a conductive material is connected to a d.c. high voltage source 8. In sputtering d.c. electric power of, e.g., 10 KW to 20 KW is applied to the cathode 3 to generate glow discharge between the cathode 3 and the anode 6. Ion particles are caused by the glow discharge to collide on the target 4 adhered to the underside of the cathode 3, and sputtering particles from the target 4 are caused to adhere to the surface of the object to be processed W mounted opposed to the target 4. A permanent magnet 9 which is rotated by drive means 9a is disposed above the cathode 3. The permanent electrode 9 forms a transverse electromagnetic field near the cathode 3 to trap secondary ions so as to enhance the ionization. A cooling jacket 10 is incorporated in the cathode 3. A coolant, e.g., cooling water is circulated in the jacket so as to suppress temperature rise of the cathode 3 and the target 4.

A base material of the target 4 opposed to the object to be processed W is selected in accordance with thin films to be formed on the object to be processed W. Materials of the thin films to be formed on the semiconductor wafer W by the sputtering are, e.g., aluminium, silicon, tungsten, titanium, molybdenum, chrome, cobalt, nickel, etc., and their alloys. The target 4 may have various shapes, such as stepped sectional shapes, circular shapes, conical shapes, rectangular, pyramidal, and other shapes.

The mount 6 of a conductive metal, such as aluminium, which is also the anode 6, is disposed at a lower part in the processing vessel 2. The mount is substantially cylindrical and is lifted by a lift mechanism 11, and has heating means 12, e.g., a heater, built in, so that the object to be processed W can be heated to a required temperature, e.g., 200° C. A pipe 13 supplies nitrogen gas, etc. to the underside of the object to be processed W to improve thermal conduction characteristic of the heating means 12.

Figure 11:
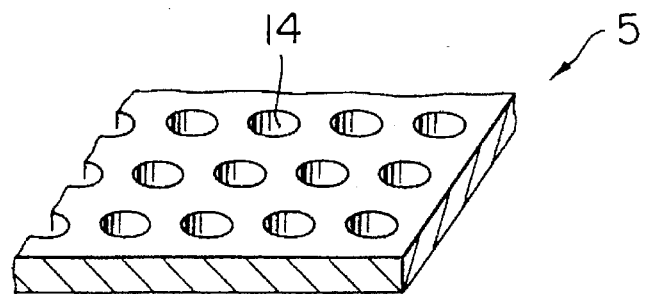
FIG. 11 is a partial perspective view of a conventional collimator with circular through-holes.
Figure 12:
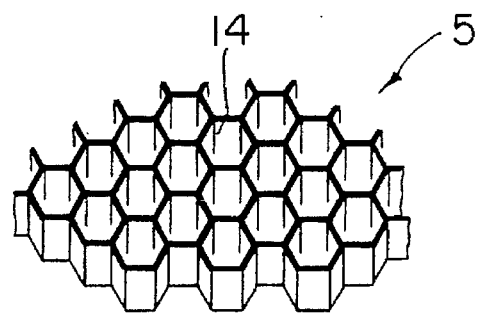
FIG. 12 is a partial perspective view of a conventional collimator with a honeycomb of through-holes.

A collimator 5 is disposed between the cathode 3 and the target 4, and the anode (mount) 6. The collimator 5 comprises stainless steel and has a substantially cylindrical shape. As shown in FIGS. 11 and 12, the collimator 5 includes a honeycomb of a number of through-holes 14 or a number of cylindrical through-holes 14 directed from the side of the target to the side of an object to be processed. The thus-constituted collimator 5 selectively admits only substantially perpendicular components of sputtering particles from the target 4 therethrough to the side of the object to be processed, with a result of improved step coverage.

A shield 15 of, e.g., stainless steel is provided inside the processing vessel 2, enclosing a space from the cathode 3 to the anode (the mount) 6 in which sputtering particles transfer, whereby the inside wall of the processing vessel 2 is protected from sputtering particles.

As shown in FIG. 1, the processing vessel 2 is connected to a processing gas feed pipe 18 which supplies required processing gases to the processing vessel 2 from gas sources through a mass flow controller 17. An inert gas, such as argon, is supplied at a set flow rate. An exhaust port 19 is provided in a lower part of the processing vessel 2, so that the interior of the processing vessel 2 is evacuated to a required pressure by a vacuum pump, e.g., a dry pump not shown.

Figure 3:
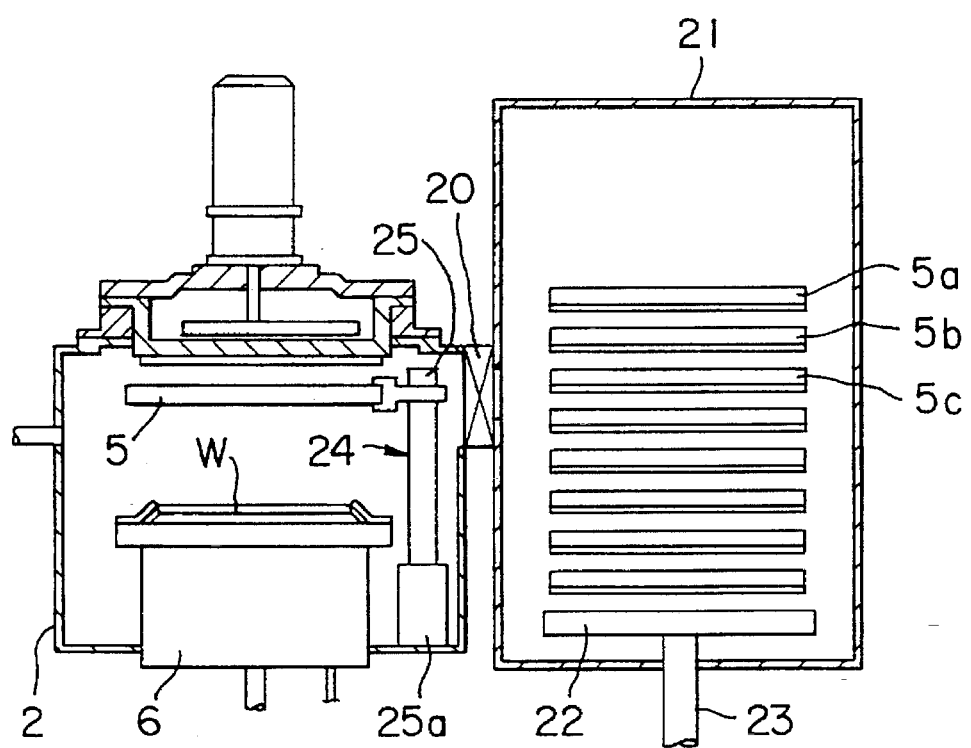
FIG. 3 is a side view of the collimator exchange of FIG. 2.

A spare collimator storage chamber 21 is provided adjacent to one side of the processing vessel 2 through a gate valve 20. The spare collimator storage chamber 21 accommodates collimator cassettes 22 holding, e.g., 10 sheets of collimators 5a, 5b, 5c, . . . , on shelves. As shown in FIG. 3, the collimator cassettes 22 are moved up and down by a lift mechanism 23 driven by a servomotor (not shown). The collimator cassettes 22 are moved up and down to locate a collimator cassette at a position where a collimator 5 which, by use, has lowered its film forming speed and has become ready to generate particles with a new collimator 5a in the collimator cassette by a collimator exchanger 24 disposed in the processing vessel near the gate valve 20.

Figure 2:
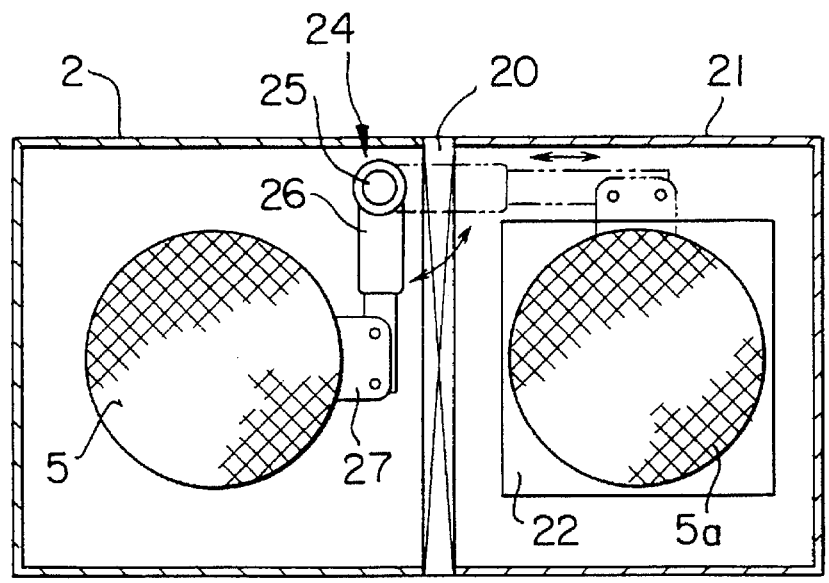
FIG. 2 is a plan view of a first embodiment of the collimator exchanger provided in the sputtering system of FIG. 1.

As shown in FIG. 2, the collimator exchanger 24 comprises a rotary drive unit 25 driven by a biaxial servomotor 25a, a retractable arm 26 and a collimator holder 27. The collimator holder 27 holds the collimator 5, and turns and transfers the same between the processing chamber 2 and the spare collimator storage chamber 21. An internal pressure of the spare collimator storage chamber 21 is adjusted to be substantially equal to an internal pressure of the processing vessel 2, whereby with the pressure atmosphere in the processing vessel 21 maintained without releasing the interior of the processing vessel from a vacuum, a used collimator 5 in the processing vessel 2 is taken out onto an empty collimator cassette 22 in the spare collimator storage chamber 21 adjacent to the processing vessel 2. Then the new collimator 5a is taken out of the collimator cassette 22, and the new collimator 5a is set at a required position in the processing vessel 2. Thus, a string of collimator replacing operations is completed. In this operation, the collimator cassettes 22 themselves are moved up and down to position an empty collimator cassette or a collimator cassette holding a new cassette at a height of collimator replacement of the collimator exchanger 24, whereby the collimator replacing operation can be easy.

Figure 4:
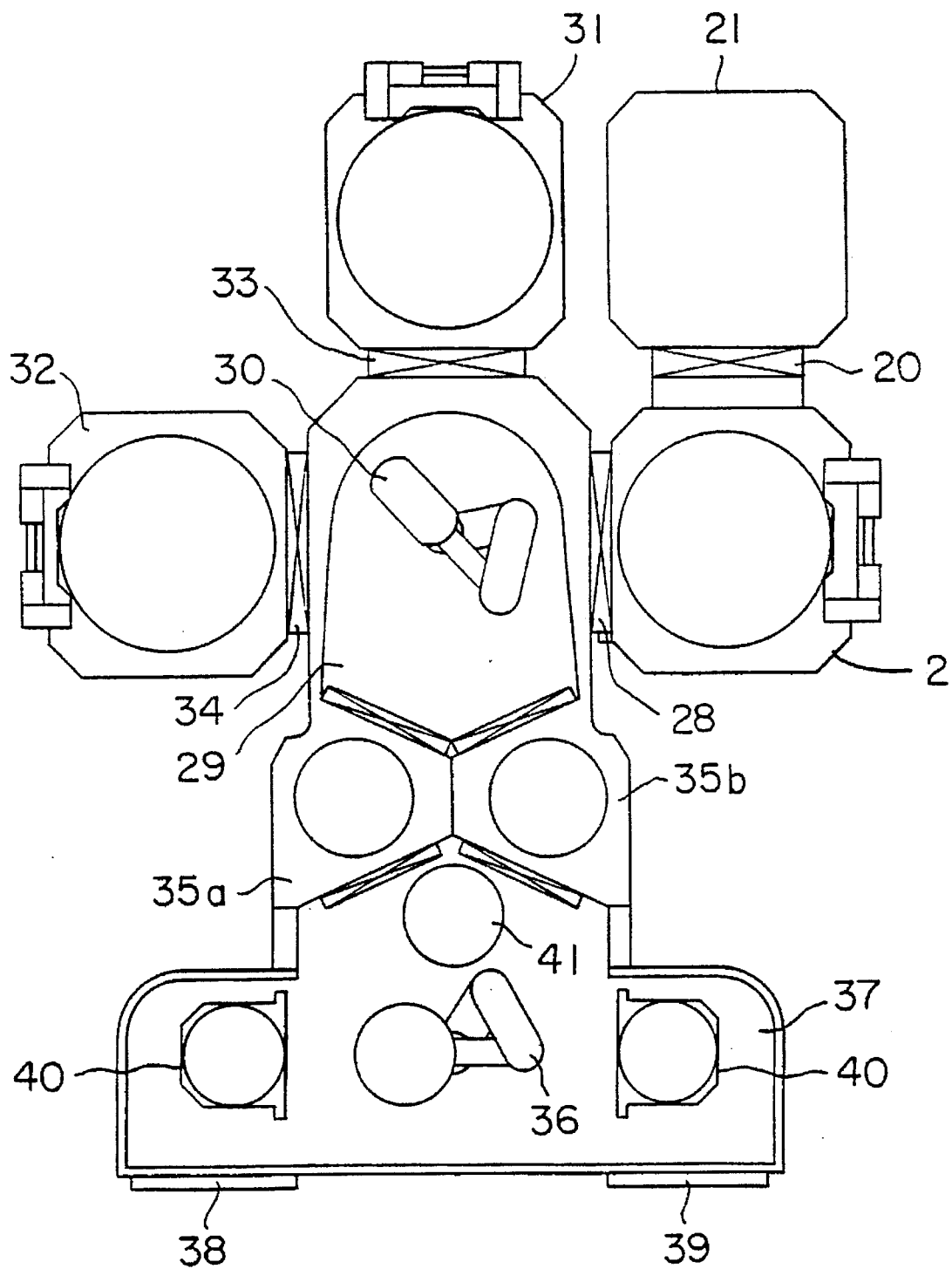
FIG. 4 is a schematic plan view of a multi-chamber semiconductor fabrication apparatus provided in the sputtering system of FIG. 1.

As shown in FIG. 4, a transfer chamber 29 is disposed on the other side of the processing chamber 2 through a gate valve 28. A transfer mechanism 30 with a transfer arm 21 is disposed in the transfer chamber 29. To sides of the transfer chamber 29 there are connected a plurality of processing vessels 31, 32 for various processing, such as sputtering, etching, etc. through respective gate valves 33, 34. Thus a multi-chamber semiconductor fabrication apparatus is constituted. To one side of the transfer chamber 29 there is connected a loader/unloader chamber 37 with a carrier arm 36 and positioning means 41 through pre-vacuum chambers 35a, 35b. The loader/unloader chamber 37 has a loader opening 38 and an unloader opening 39. A cassette 40 of a set number, e.g., 25 sheets, of objects-to-be-processed can be carried in/out through the loader opening 38/the unloader opening 39.

The DC magnetron sputtering system according to the first embodiment of the present invention is constituted.

Figure 13:
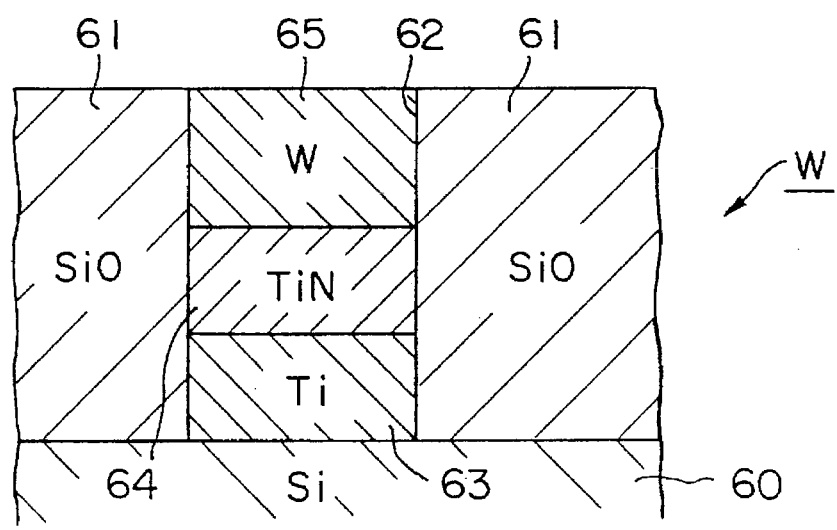
FIG. 13 is an explanatory view of burying with tungsten, a contact hole formed in an inter-layer insulation layer of an object to be processed.

Then the operation of forming a titanium film 63 and a titanium nitride film 64 in a contact hole 62 formed in an inter-silicon oxide film insulation film 61 formed on a silicon 60 of a semiconductor wafer W as shown in FIG. 13 by the multi-chamber semiconductor fabrication apparatus with the DC magnetron sputtering system according to the present embodiment will be explained.

As shown in FIG. 4, semiconductor wafers W with oxide films formed on beforehand are taken by the carrier arm 36 one by one out of a cassette 40 loaded in the loader-unloader chamber 37 and positioned by the positioning means 41, based on orientation flats formed in the wafers W, and then carried into the pre-vacuum chamber 35a. Then the transfer mechanism 30 in the transfer chamber 29 receives a wafer W and transfers the same W into, e.g., the etching processing vessel 31. There a required contact hole is etched in an inter-layer insulation layer for the wafer of silicon oxide.

When the etching is over, the transfer mechanism 30 takes the wafer out of the processing vessel 31 and transfers the same into the sputtering processing vessel 2 and onto the mount 6. The wafer W is secured by the chuck 7. While the interior of the processing vessel 2 is being evacuated to $1^{-2}$–$10^{-3}$ Torr, argon gas is introduced into the processing vessel 2 through the gas feed pipe 18 in FIG. 1, and the wafer W is heated by the heater 12 up to a required temperature. After the wafer W has been heated up to, e.g., 200° C., a d.c. high voltage current of, e.g., 1 KW to 20 KW is applied to between the cathode 3 and the anode 6 to generate glow discharge. The glow discharge causes ion particles to impinge on the target 4 of titanium, and titanium particles sputtered from the target are adhered to the processing surface of the wafer W mounted at a position opposed to the target 4. Secondary ions are trapped by a transverse electromagnetic field formed near the cathode 3 by a permanent magnet 9 provided above the cathode 3 to enhance the ionization. A coolant, e.g., cooling water, is circulated in the cooling jacket 10 built in the cathode 3 suppress temperature rise of the cathode 3 and the target 4.

When the titanium particles thus sputtered from the target 4 pass through the collimator 5, only substantially perpendicular components are selected by the through-holes 14, and a contact hole 62 formed in the inter-layer insulation layer 61 in FIG. 13 is buried by a required thickness by step coverage. And an ohmic contact layer 63 is formed. Then a titanium nitride layer 64 as a barrier layer is formed on the titanium layer 63. In this case, nitrogen gas is further introduced through the gas feed pipe 18 in FIG. 1 to nitrify the titanium near the wafer W to adhere the titanium nitride layer 64 on the titanium layer 63. After a flow of such sputtering processing is over, the wafer W is taken out of the sputtering vessel 2 by the transfer arm 30 and is transferred into a CVD processing vessel 32. There a tungsten layer 65 is formed on the titanium nitride layer 64 by CVD. Thus a contact hole with a wiring material of tungsten buried in the contact hole 62 is completed.

The wafer W which has been subjected to the processing is taken by the transfer arm 30 out of the CVD processing vessel 32 and returned into the pre-vacuum chamber 35b. There the wafer W is transferred to the carrier arm 36 in the loader/unloader chamber 37, returned to the cassette 40, and is unloaded in the cassette 40 together with the reset wafers W out of the apparatus 40.

As described above, by the use of the multi-chamber semiconductor fabrication apparatus of FIG. 4, wiring processing can be thus continuously conducted on, wafers W. While number of wafers W are processed, sputtering particles adhering to the inside surfaces of the through-holes 14 of the collimator 5 used in the above-described sputtering system 2 reduce a diameter of the through-holes 14 for sputtering particles to pass, with possible risks that a film forming speed will be lowered, and peeling films will result in particles. Then to maintain an original throughput and yield, it is necessary to replace the collimator with a new one at a set timing of, e.g., a set number of wafers W or a set period of processing time, or every time a counted value of particles read by a particle counter reaches a set threshold value.

To this end, in the conventional processing apparatus, every time the collimator is replaced with a new one, the processing apparatus pauses, the interior of the processing vessel is released from a vacuum and are opened to the atmospheric air, and after a new collimator is installed, the interior of the processing vessel is evacuated. Thus the replacement of a collimator takes much time. But according to the processing apparatus of the present invention, when a collimator 5 is replaced, a pressure in the space collimator storage chamber 21 is adjusted to be substantially equal to that in the processing vessel 2 and then the gate valve 20 is opened to take out a collimator 5 to be replaced by the collimator exchanger 24, the collimator cassettes 22 in the spare collimator storage chamber 21 are lifted to locate the empty shelf associated with the used collimator at the transfer position. Then the collimator exchanger 24 recovers the used collimator 5 onto the empty shelf, and then the collimator cassettes 22 are lifted to locate a shelf mounting a new collimator 5a to the transfer position. Next, the collimator exchanger 24 is moved and turned to take out the new collimator 5a and carry the same into the processing vessel 2, and sets the same at a sets position. Then the gate valve 20 is again closed, and a flow of the collimator exchanging operation is completed. A collimator 5 can be replaced with a new one without opening the interior of the processing vessel into the atmospheric air for each replacement of a collimator 5. In addition, the operation of replacing a collimator 5 can be fully automated, and the processing apparatus can have improved throughputs.

[Second Embodiment]

Figure 5:
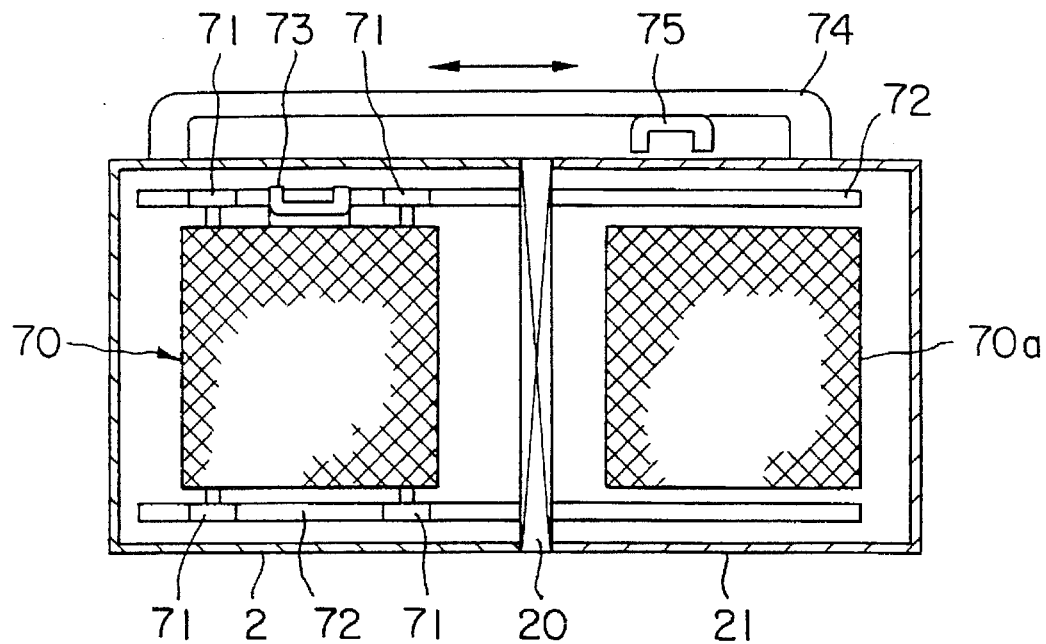
FIG. 5 is a plan view of a second embodiment of the collimator exchanger provided in the sputtering system of FIG. 1.
Figure 6:
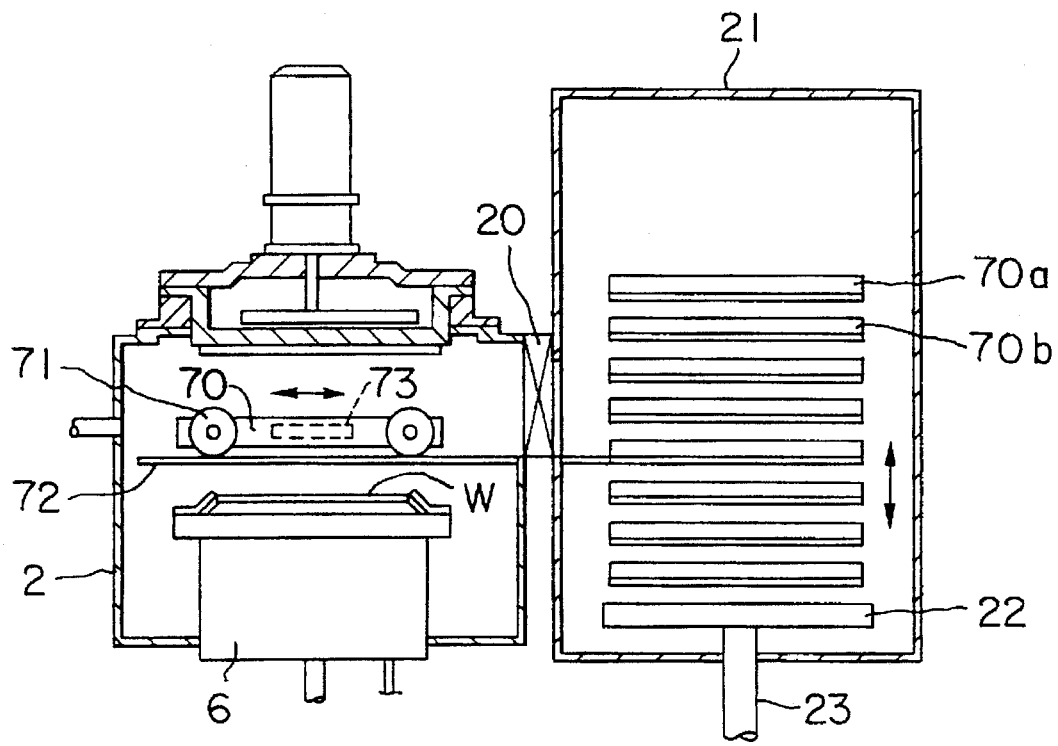
FIG. 6 is a side view of the collimator exchanger of FIG. 5.

Then a second embodiment of the collimator exchanger which is applicable to the processing apparatus of FIGS. 1 and 4 will be explained with reference to FIGS. 5 and 6. In the present specification members of the second embodiment having the same functions as the first embodiment are represented by the same reference numerals not to repeat their explanation.

In the second embodiment, a collimator 70 is made of a substantially rectangular plate. A pair of rollers 71 with bearings incorporated is provided on one pair of opposed sides of the substantially rectangular plate which are the front and the rear portions of the collimator 70 and is movable along a guide rail 71 extended over a processing vessel 2 and a spare collimator storage chamber 21. A first magnet 73 is provided on one of the pair of sides. Outside the apparatus there is provided a second magnet 75 which is movable along a guide rail 74 extended over the processing vessel 2 and the spare collimator storage chamber 21. In this arrangement, when a used collimator is replaced, an attractive force is generated between the first and the second magnets 73, 75, and the second magnet 75 is moved by suitable means in the direction of the arrow to move the collimator 70 with the first magnet 73 along the guide rail 72. The used collimator is replaced by a spare collimator 70a, 70b.

[Third Embodiment]

Figure 7:
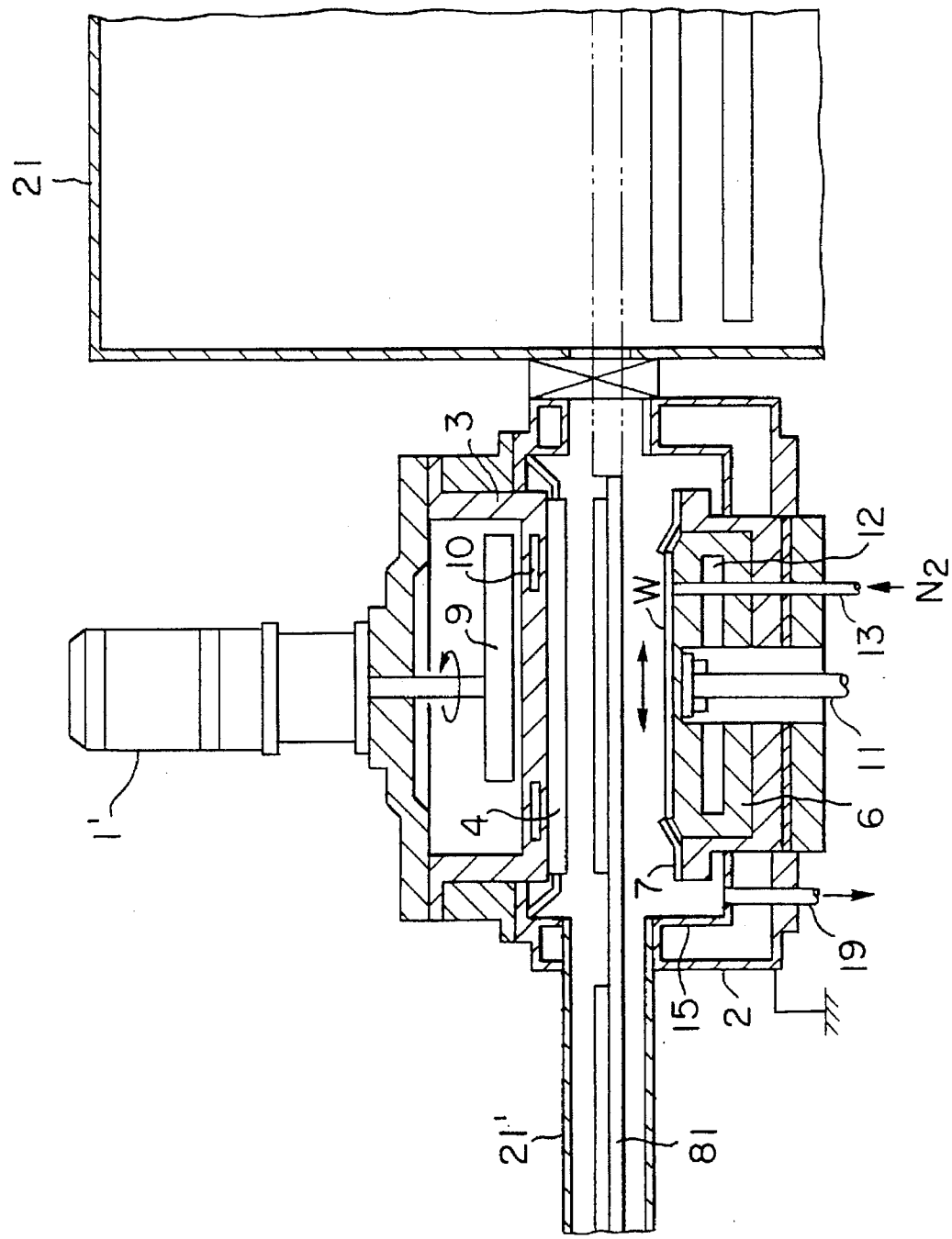
FIG. 7 is a schematic vertical sectional view of another embodiment of the DC magnetron sputtering system used in the processing apparatus according to the present invention.

FIG. 7 shows a third embodiment of the sputtering system involved in the present invention. The basic constitution of the sputtering system 1' according to the third embodiment is the same as the sputtering system 1 of FIG. 1. But the third embodiment does not include the gate valve 20, and a processing vessel 2 and spare collimator storage chamber 21 are formed in one-piece, so that replacement of a used collimator with a spare collimator is easy and quick. In the third embodiment, a turnout chamber 21' for a collimator exchanger 30 which will be explained is formed on the side opposite to the spare collimator storage chamber 21.

Figure 8:
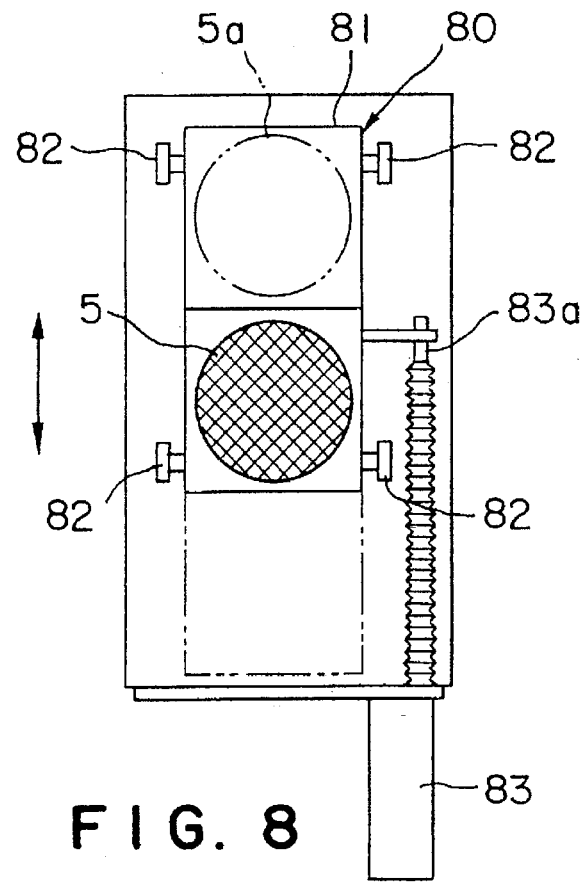
FIG. 8 is a plan view of a third embodiment of the collimator exchanger provided in the sputtering system of FIG. 7.

As shown in FIG. 8, the collimator exchanger 80 used in the third embodiment includes a collimator holder 81 which can mount two collimators. A pair of rollers 82 with bearings incorporated are provided on one pair of opposed sides of the collimator holder 81 which are the front and the rear portions of the collimator holder 81 and are moved along a guide rail not shown over the processing vessel 2 and the spare collimator storage chamber 21, and the turnout chamber 21' in accordance with expansion of a rod 83a of an air cylinder 83.

In this arrangement, a first collimator 5 and a second collimator 5a, for example, are mounted on the collimator holder 81. Sputtering is conducted first on the first collimator 5 on a set number of wafers for a required period of time, and then the collimator holder 81 is moved to the turnout chamber 21' to retreat the first collimator 5 into the turnout chamber 21'. The second collimator 5a is positioned at a processing position, and sputtering is conducted on a set number of wafers for a set period of time by the use of the second collimator 5a. Then the collimator holder 81 is received in the spare collimator storage chamber 21. There the collimator holder 81 itself, or only the first and the second collimators 5, 5a are replaced. Then the first collimator 5 is located at a set position, and the sputtering is again conducted.

Figure 9:
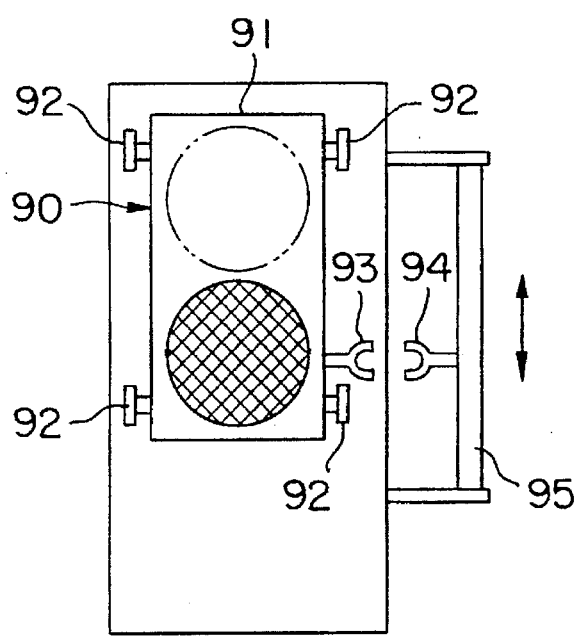
FIG. 9 is a plan view of another embodiment of the collimator exchanger provided in the sputtering system of FIG. 7.

The collimator exchanger 80 of FIG. 8 is driven by the air cylinder 83, but it is not essential to the present invention. For example, as shown in FIG. 9, it is possible that a first magnet 92 provided on the collimator 91 having a pair of rollers 92 with bearings incorporated which are provided on the front and rear portions of the collimator holder 91, and a second magnet 94 which is provided outside the apparatus and is movable along a guide rail 95 are used, and as in the embodiment of FIGS. 5 and 6, the magnet 94 is moved to drive the collimator holder 91 by a magnetic force.

Figure 10:
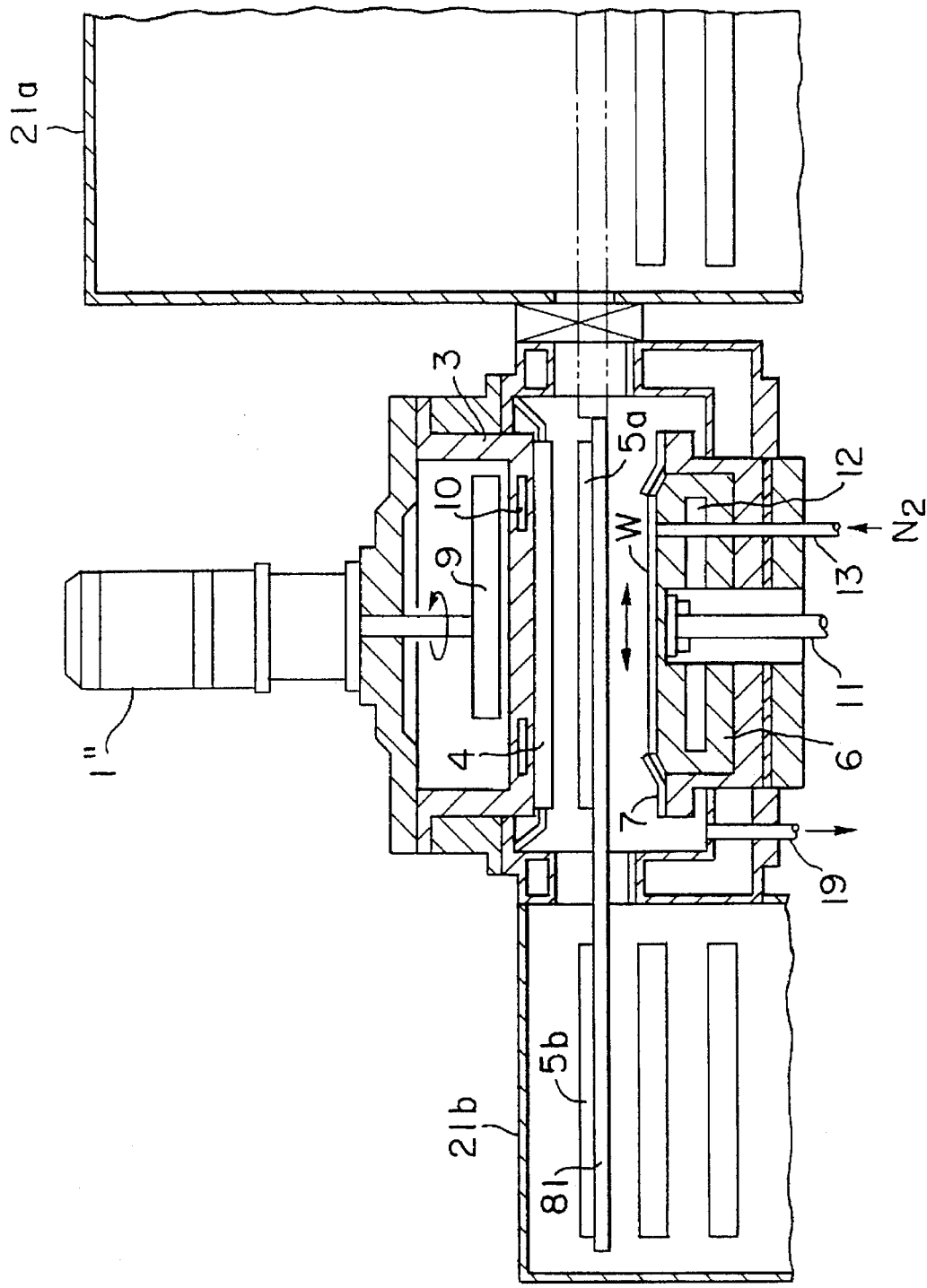
FIG. 10 is a schematic vertical sectional view of a further embodiment of the DC magnetron sputtering system used in the processing apparatus according to the present invention.

As in the sputtering system 1" of FIG. 10, a first and a second spare collimator storage chamber 21a, 21b are provided on both sides of the processing vessel 2. In this arrangement while sputtering is being conducted, using a first collimator 5a (on the right side as viewed in the drawing) mounted on the collimator holder 81 in the collimator exchanger 80, a second collimator 5b (on the left side as viewed in the drawing) is replaced in the second spare collimator storage chamber 21b, and oppositely while sputtering is conducted, using the second collimator 5b, the first collimator 5a can be replaced in the first spare collimator storage chamber 21. This can shorten collimator replacing time.

In the above, the processing apparatus of the present invention has been explained by means of a DC magnetron sputtering system as one embodiment of the present invention, but the present invention is not limited to the embodiment. The present invention is applicable to various sputtering systems, such as high-frequency sputtering systems, opposed target sputtering systems, ECR sputtering systems, bias sputtering systems, etc. The present invention is not limited to sputtering systems but is applicable to all processing apparatuses including collimators for restricting sputtering directions of sputtered particles. The present invention is not limited to formation of titanium/titanium nitride films but is applicable to sputtering of any material.

As described above, according to the present invention, a collimator can be replaced without opening the interior of the processing vessel to the atmospheric air. Accordingly a collimator can be replaced with a new one before a film forming speed is lowered due to sputtering particles adhered to the collimator and before a large amount of particles are generated. In addition, the replacement is quick and easy. Throughputs and yields of the apparatus can be improved.

That is, because the spare collimator storage chamber and the processing chamber are adjacent to each other, a collimator which reduces a film forming speed and is ready to generate particles can be quickly and readily replaced with a spare collimator. Throughputs of the apparatus can be improved.

Because the spare collimator storage chamber and the processing chamber are in communication with each other through the gate valve, when a collimator is replaced, a pressure of the interior of the spare collimator storage chamber is adjusted to be substantially equal to that of the processing chamber, and the gate valve is opened, whereby the collimator can be replaced in a further shorter time without destroying a pressure atmosphere in the processing chamber.

Furthermore, the collimator holder which can hold more than two collimators is simply moved between at least two positions, between the spare collimator storage chamber and the processing chamber, whereby a used collimator can be replaced with a spare collimator. The procedure for replacing a collimator can be more convenient and takes less time. In this case, the replacement of a used collimator with a spare collimator is made possible several times in the spare collimator storage chamber, whereby processing can be continuously conducted for a longer time with a processing atmosphere in the processing chamber retained.

The collimator replacement is conducted between the spare collimator storage chamber and the processing chamber, using the collimator holder which can hold one collimator, whereby a collimator can be replaced in smaller spaces. In this case as well, the replacement of a used collimator with a spare collimator is made possible several times in the spare collimator storage chamber, whereby processing can be continuously conducted for a longer time with a processing atmosphere in the processing chamber retained.

What is claimed is:

1. A processing apparatus in which an object to be processed and a target are opposed to each other in a processing chamber, and sputtering directions of sputtering particles from the target are restricted by a collimator, the processing apparatus comprising:

a spare collimator storage chamber disposed adjacent to the processing chamber for storing at least one spare collimator; and collimator exchanging means, including collimator holding means which can hold two or more collimators, the collimators holding means being movable between at least two positions at the spare collimator storage chamber and the processing chamber, wherein the collimators held by the collimator holding means are located at each of the positions, whereby a collimator in the processing chamber is replaced by a spare collimator in the spare collimator storage chamber by the collimator exchanging means through a gate valve provided between the processing chamber and the spare collimator storage chamber when a collimator exchange is required.

2. The processing apparatus according to claim 1, wherein the spare collimator storage chamber includes two or more collimator cassettes which can accommodate the collimators; and the apparatus positions collimator cassettes to transfer the collimators thereof between the collimator holding means and the collimator cassettes.

3. The processing apparatus according to claim 1, wherein the spare collimator storage chamber includes two or more collimator cassettes which can accommodate collimators; and the apparatus includes a lift mechanism for adjusting height-wise positions of the collimators to transfer the collimators between the collimator cassettes and the collimator holding means.

4. A processing apparatus in which an object to be processed and a target are opposed to each other in a processing chamber, and sputtering directions of sputtering particles from the target are restricted by a collimator, the processing apparatus comprising:

a spare collimator storage chamber disposed adjacent to the processing chamber for storing at least one spare collimator; and collimator exchanging means, including collimator holding means which can hold one collimator, the collimator holding means being movable between at least two positions at the spare collimator storage chamber and the processing chamber, wherein the collimator held by the collimator holding mean is located at one position, whereby a collimator in the processing chamber is replaced by a spare collimator in the spare collimator storage chamber by the collimator exchanging means through a gate valve provided between the processing chamber and the spare collimator storage chamber when a collimator exchange is required;

the collimator holding means having a collimator holder, a rotary device unit, and a retractable arm;

the retractable arm capable of contracting to fit within the processing chamber and extending into the spare collimator storage chamber to allow replacement of the collimator in the collimator holding means.

5. The processing apparatus according to claim 4, wherein the spare collimator storage chamber includes two or more collimator cassettes which can accommodate the collimators; and the apparatus positions collimator cassettes to transfer the collimators thereof between the collimator holding means and the collimator cassettes.

6. The processing apparatus according to claim 4, wherein the spare collimator storage chamber includes two or more collimator cassettes which can accommodate collimators; and the apparatus includes a lift mechanism for adjusting height-wise positions of the collimators to transfer the collimators between the collimator cassettes and the collimator holding means.

* * * * *